United States Patent
Sofman

[19]

[11] Patent Number: 6,038,390
[45] Date of Patent: Mar. 14, 2000

[54] METHOD OF SELECTING SPANS FOR FIBER CUT SIMULATIONS

[75] Inventor: Lev B. Sofman, Plano, Tex.

[73] Assignee: MCI Communications Corporation, Washington, D.C.

[21] Appl. No.: 08/954,780

[22] Filed: Oct. 21, 1997

[51] Int. Cl.[7] .................................................. G06F 19/00
[52] U.S. Cl. ................................ 395/500.34; 395/500.13
[58] Field of Search ........................ 395/500.03, 500.13, 395/500.14, 500.15, 500.34

[56] References Cited

U.S. PATENT DOCUMENTS

| | | | |
|---|---|---|---|
| 3,735,109 | 5/1973 | Berthelemy et al. ............... | 395/500.24 |
| 4,816,999 | 3/1989 | Berman et al. ..................... | 395/500.03 |
| 5,638,290 | 6/1997 | Ginetti et al. ...................... | 395/500.03 |
| 5,764,954 | 6/1998 | Fuller et al. ....................... | 395/500.13 |

*Primary Examiner*—Kevin J. Teska
*Assistant Examiner*—Kyle J. Choi

[57] ABSTRACT

A method of selecting an optimal set of spans for fiber cut simulations for a network carrying a plurality of demand-routes between a plurality of nodes interconnected by a plurality of fiber spans includes the steps of selecting from the plurality of spans a set of critical spans and selecting from the set of critical spans a minimal set of critical spans.

20 Claims, 7 Drawing Sheets

|   | 1 | 2 | 3 | 4 | 5 | 6 | 7 | 8 | 9 | 10 | 11 | 12 | 13 |
|---|---|---|---|---|---|---|---|---|---|----|----|----|----|
| 1 | 1 | 1 | 1 | 0 | 0 | 0 | 0 | 0 | 0 | 0  | 0  | 0  | 0  |
| 2 | 0 | 0 | 0 | 1 | 1 | 1 | 0 | 0 | 0 | 0  | 0  | 0  | 0  |
| 3 | 0 | 0 | 0 | 0 | 1 | 1 | 1 | 0 | 0 | 0  | 0  | 0  | 0  |
| 4 | 0 | 0 | 0 | 0 | 0 | 0 | 0 | 0 | 1 | 1  | 1  | 0  | 0  |
| 5 | 0 | 0 | 0 | 0 | 1 | 1 | 1 | 0 | 0 | 0  | 0  | 1  | 1  |
| 6 | 1 | 1 | 0 | 1 | 1 | 0 | 0 | 0 | 0 | 0  | 0  | 0  | 0  |

FIG. 8

|    | 1 | 2 | 3 | 4 | 5 | 6 | 7 | 8 | 9 | 10 | 11 | 12 | 13 |
|----|---|---|---|---|---|---|---|---|---|----|----|----|----|
| 1  | = | = | > |   |   |   |   |   |   |    |    |    |    |
| 2  | = | = | > |   |   |   |   |   |   |    |    |    |    |
| 3  | < | < | = |   |   |   |   |   |   |    |    |    |    |
| 4  |   |   |   | = | < |   |   | > |   |    |    |    |    |
| 5  |   |   |   | > | = | > | > |   |   |    |    |    |    |
| 6  |   |   |   |   | < | = |   |   |   |    |    | >  | >  |
| 7  |   |   |   |   | < |   | = |   |   |    |    | >  | >  |
| 8  |   |   |   | < |   |   |   | = |   |    |    |    |    |
| 9  |   |   |   |   |   |   |   |   | = | =  | =  |    |    |
| 10 |   |   |   |   |   |   |   |   | = | =  | =  |    |    |
| 11 |   |   |   |   |   |   |   |   | = | =  | =  |    |    |
| 12 |   |   |   |   |   | < | < |   |   |    |    | =  | =  |
| 13 |   |   |   |   |   | < | < |   |   |    |    | =  | =  |

FIG. 9

METHOD OF SELECTING SPANS FOR FIBER CUT SIMULATIONS

FIELD OF THE INVENTION

The present invention relates generally to network simulation, and more particularly to a method of selecting spans for fiber cut simulations.

DESCRIPTION OF THE PRIOR ART

Modern digital telecommunications systems are built upon a hierarchial network. A network consists of a plurality of nodes or sites that are interconnected by spans or transmission facilities. Generally, lower bandwidth level demands are multiplexed into higher bandwidth demands. For example, up to twenty-eight 1.544 Mbps DS0 channels can be multiplexed into a single 44.376 Mbps DS3 channel. Similarly, up to twelve DS3 channels can be multiplexed into a single 622.08 Mbps OC 12 channel. Finally, up to sixteen OC 12 channels can be multiplexed into a single 9.953 Gbps OC 192 channel.

It is the goal of a telecommunications network designed to serve the demand at the least cost, while maintaining an acceptable level of survivability in the event of equipment failures. Two elements of cost in a network are transmission costs and equipment costs. The transmission cost is generally based upon the transmission distance. An element of equipment cost is the cost per port necessary to multiplex multiple channels into a single channel. Generally, transmission costs can be minimized by multiplexing as much demand as possible into as few transmission channels as possible. However, equipment costs may be minimized by multiplexing as few channels as possible. Thus, transmission costs and equipment costs compete with each other, and optimization of a network requires trade-offs.

Network survivability requires that the network have excess capacity that may be used in the case of a failure. For example, if a span between two nodes is cut and there is exactly enough capacity in the network to meet the demand prior to the cut, there is no place to put the traffic carried by the cut span. Thus, a network with no excess capacity cannot be restored in the event of a cut span. In order to provide an acceptable level of restorability, excess capacity must be built into the network. However, excess capacity increases the cost of the network.

Network designers use various computer simulation tools in order to determine the minimum excess capacity necessary to ensure an acceptable level of network survivability in the event of fiber cut. In a simulation, various levels of overtrunking are tested to determine the number of blocked calls that will result from fiber cuts at various times of the day. Each simulation requires hours of computer time. In a large network with three hundred or more spans, several hundred hours of computer time are necessary to simulate the results of cutting each span of the network.

It is therefore an object of the present invention to provide a method of reducing the number of spans used in cut span simulations.

SUMMARY OF THE INVENTION

The present invention provides a method of selecting an optimal set of spans for fiber cut simulations for a network carrying a plurality of demand-routes between a plurality of nodes interconnected by a plurality of fiber spans. Briefly, the method includes the steps of selecting from the plurality of spans a set of critical spans and selecting from the set of critical spans a minimal set of critical spans.

Each span of the network forms a link between nodes and each span is part of one or more demand-routes. Thus, there is a set of demand-routes for each span. There is a hierarchy of spans of a network based upon their respective sets of demand-routes. Spans that have identical sets of demand-routes are equivalent to each other. A span that has a set of demand-routes that is a proper subset of the set of demand-routes of another span is considered to be a child span of the other span, with the other span being considered the parent span. A span can be both a child span and a parent span. Also, a span can have none, one, or more parent spans, or none, one, or more child spans.

A critical span is a span that has no parent spans. In other words, a critical span is a span having a set demand-routes that is not a proper subset of a set of demand-routes for any other span of the network. Critical spans may be equivalent to each other. A minimal set of critical spans is formed by including only one critical span that is equivalent to another critical span.

The method of the present invention is preferably a computer implement process. The method of selecting a set of critical spans from the plurality of spans includes the computer implemented steps of constructing a span demand-route dependency matrix and a span hierarchy matrix. The span demand-route dependency matrix has a row for each demand-route and a column for each span. For each row r of the span demand-route dependency matrix, the method inserts a one at element (r,s) if the span s corresponds to a link of the demand-route r.

The span hierarchy matrix includes a row for each span and a column for each span. The method selects an x-th row of the span hierarchy matrix and a y-th column of the span hierarchy matrix. The method insert a first indicia at element (x,y) of the span hierarchy matrix if x is equal to y. If x is not equal to y, the method sets a less flag to false, a more flag to false, a first empty flag to true, and a second empty flag to true. The method selects an r-th row of the span demand-route hierarchy matrix, and sets the less flag to true and one of the empty flags to false if element (x,r) of the span demand-route dependency matrix is equal to zero and element (y,r) of the span demand-route dependency matrix is equal to one. The method sets the more flag to true and the other of the empty flags to false if element (x,r) is equal to one and element (y,r) is equal to zero. The method sets both of the empty flags to false if both elements (x,r) and (y,r) are equal to one.

The method sets each of elements (x,y) and (y,x) of said span hierarchy matrix to the first indicia if both the more flag and the less flag are false. The method sets element (x,y) to a second indicia and element (y,x) to a third indicia if the more flag is true and the less flag is false. The method sets element (x,y) to the third indicia and element (y,x) to second indicia if the less flag is true and the more flag is false.

After populating the span hierarchy matrix, the method selects the set of critical spans by selecting an x-th row of span hierarchy matrix. Then, the method sets a critical span flag to true and selects a y-th column of the span hierarchy matrix. The method sets the critical span flag to false if element (x,y) of the span hierarchy matrix is equal to the third indicia. The method includes span x in the set of critical spans if the critical span flag is set to true.

The method selects a minimal set of critical spans by selecting an i-th and a j-th span from the set of critical spans. The method removes the j-th span from the set of critical spans if element (i,j) of the span hierarchy matrix is equal to the first indicia.

DESCRIPTION OF THE PREFERRED EMBODIMENT

Figure 1:
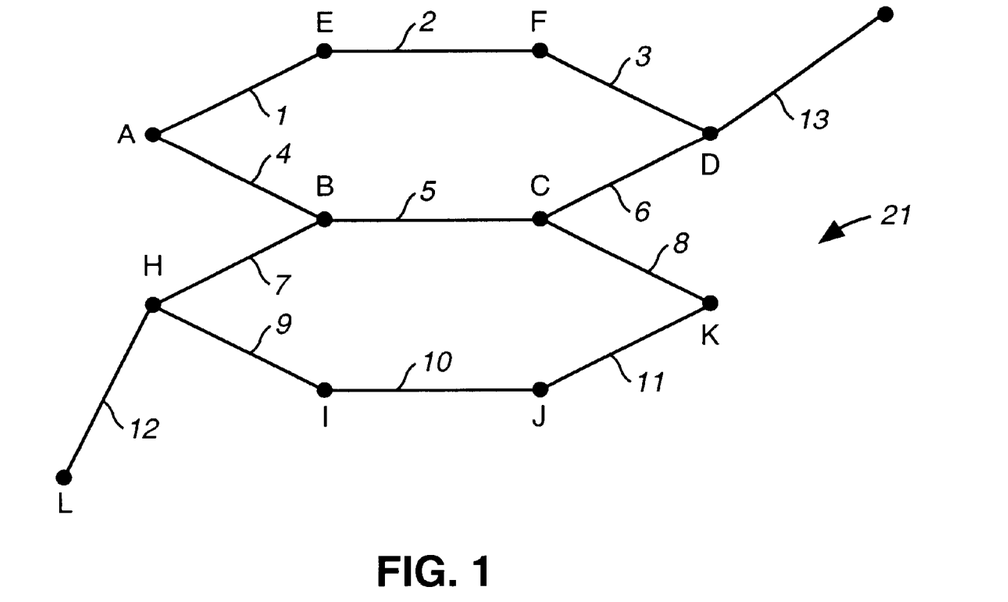
FIG. 1 is a diagram of a relatively simple network.

Referring now to the drawings, and first FIG. 1, a relatively simple network is designated generally the numeral 21. Network 21 comprises twelve nodes A–L interconnected by links or spans 1–13. Network 21 carries six demand-routes as follows:

AD North: A-E-F-D
AD South: A-B-C-D
HK North: H-B-C-K
HK South: H-I-J-K
LG: L-H-B-C-D-G
FC: F-E-A-B-C Thus, some site pairs, for example (A,D) and (H,K) use two diverse routes, i.e., north and south, for their capacity demands, and other site pairs, for example (L,G) and (F,C) use only a single route. For every site pair with capacity demand, there is a route or routes that can be used for this demand, which is referred to a demand-route. Referring to FIG. 1, each span is part of one or more demand-routes. For example, spans 12 and 13 are used only by demand-route L-G. Span 5, on the other hand, is used by demand-routes AD South, FC, HK North and LG. The span to demand-route dependency for network 21 can be summarized as follows:

Span 1 is used by AD North and FC;
Span 2 is used by AD North and FC;
Span 3 is used by AD North;
Span 4 is used by AD South and FC;
Span 5 is used by AD South, FC, HK North and LG;
Span 6 is used by AD South and LG;
Span 7 is used by HK North and LG;
Span 8 is used by HK North;
Span 9 is used by HK South;
Span 10 is used by HK South;
Span 11 is used by HK South;
Span 12 is used by LG; and
Span 13 is used by LG.

Figure 2:
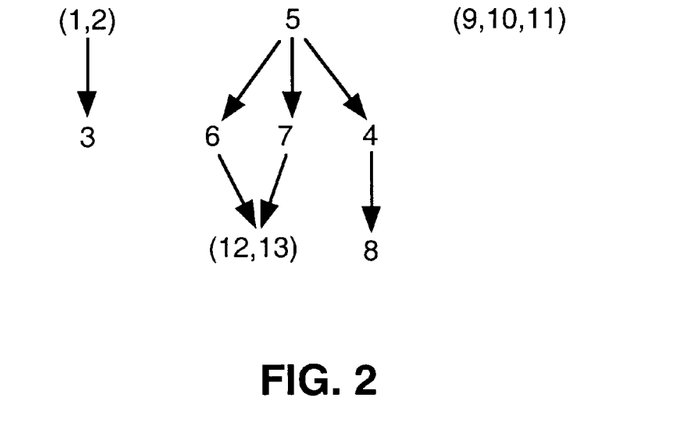
FIG. 2 is a diagram illustrating a span hierarchy of the network of FIG. 1 according to the present invention.

Using the foregoing span to demand-route dependency, it can be seen that there are two types of relationships between spans. One relationship is equivalency and the other is a parent-child relationship. Two or more spans are equivalent if they have the same set of dependent demand-routes. For example, spans 1 and 2 are equivalent because both of these spans have the same set of demand-routes, i.e., AD North and FC. In FIG. 2, which is a directed graph of the span hierarchy of network 21, a set of equivalent spans is placed in parentheses. Thus, (1,2) indicates spans 1 and 2 are equivalent. Similarly, (9,10,11) and (12,13) denote other equivalent span sets of network 21.

From a dynamically controlled routing simulation perspective, the cut of any span from an equivalent set of spans gives the same loss of capacity as the cut of any other. For example, cutting either span 1 or span 2 results in the same loss of capacity.

In the parent-child relationship, the dependent set of demand-routes for a child is a proper subset of the dependent set of demand-routes of its parent. Thus, a span i is higher in the hierarchy than a span j, if the set of dependent demand-routes for span i includes, but is not equal to, the set of dependent demand-routes for span j. In FIG. 2, an arrow indicates a parent-to-child relationship. The parent-to-child relationship is many-to-many. A span can have none, one or several children and/or parents. A critical span is a span that has no parent and is therefore highest in the hierarchy. For example, equivalent spans 1 and 2 are parents of span 3. Since spans 1 and 2 have no parents, they are critical spans. Span 5 is the parent span of spans 6 and 7, which in turn are parent spans of equivalent spans 12 and 13, and span 4, which is the parent span of span 8. Since span 5 has no parent span, it is a critical span. Finally, equivalent spans 9, 10, and 11 have no parent spans. Therefore, equivalent spans 9, 10, and 11 are critical spans.

From the cut simulation perspective, there is a dependency in the results of cut simulations of parent and child spans. If the number of blocked calls that results from the cut of a parent span is within a desired threshold, then it is guaranteed that the number of blocked calls that will result from the cut of a child span will also be within the desired threshold. Thus, effective fiber cut simulations may be conducted for the entire network by selecting only critical spans. Moreover, the number of simulations can be further reduced by selecting only one critical span from each set of equivalent critical spans. Accordingly, fiber cut simulations can be run effectively for network 21 by cutting spans 1, 5, and 9. In the example of FIG. 1, the present invention reduces the number of spans that must be selected for simulation from thirteen to three.

Figure 3:
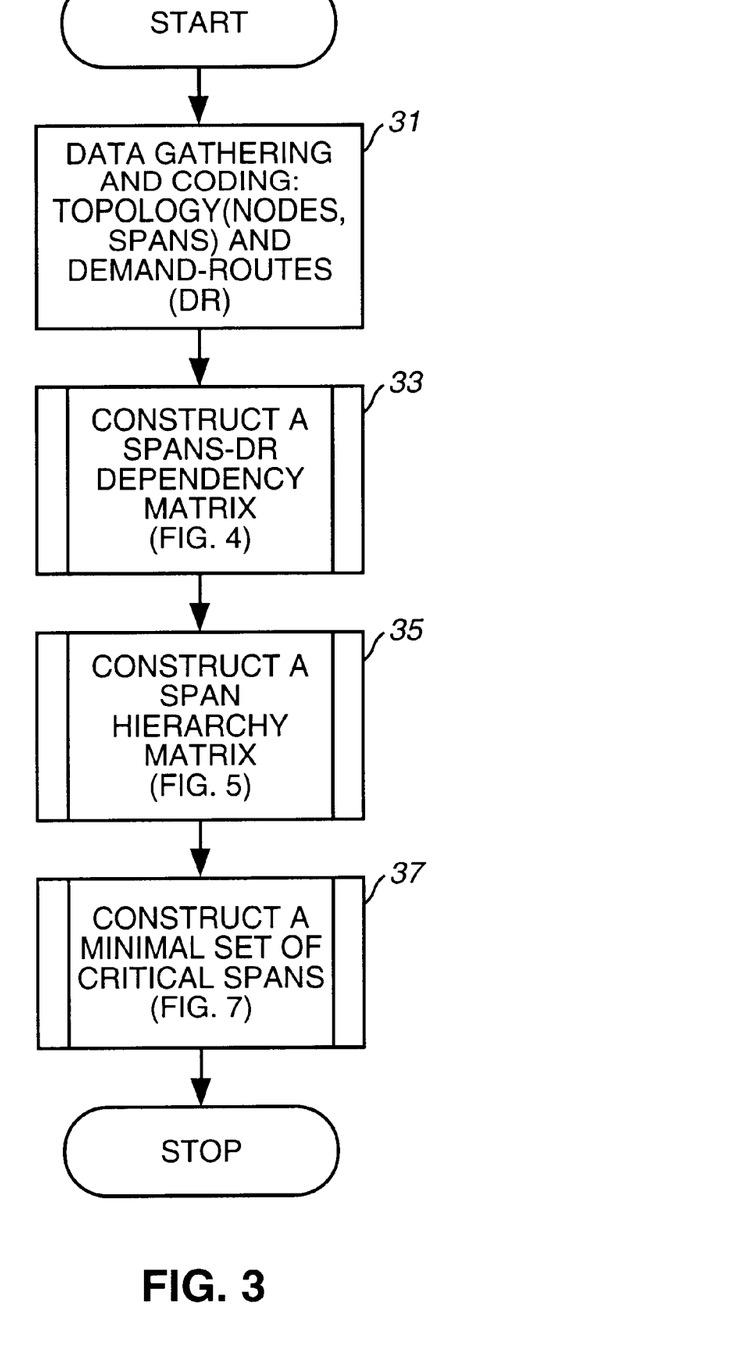
FIG. 3 is a flowchart of overall processing according to the present invention.

The present invention is preferably implemented by a computer process. Referring to FIG. 3, there is shown a high-level flowchart of the processing according to the present invention. Processing starts at block 31 where the system performs data gathering and coding. The data includes the network topology, which is the nodes and spans of the network, and the demand-routes. The process uses numerical codes as spans and demand-routes. The spans are links between nodes. In the example of FIG. 1, link A–E is span 1, link E–F is span 2, etc. The demand-routes are coded such that DR1 is AD North, DR2 is AD South, DR3 is HK North, DR4 is HK South, DR5 is LG, and DR6 is FC.

Figure 4:
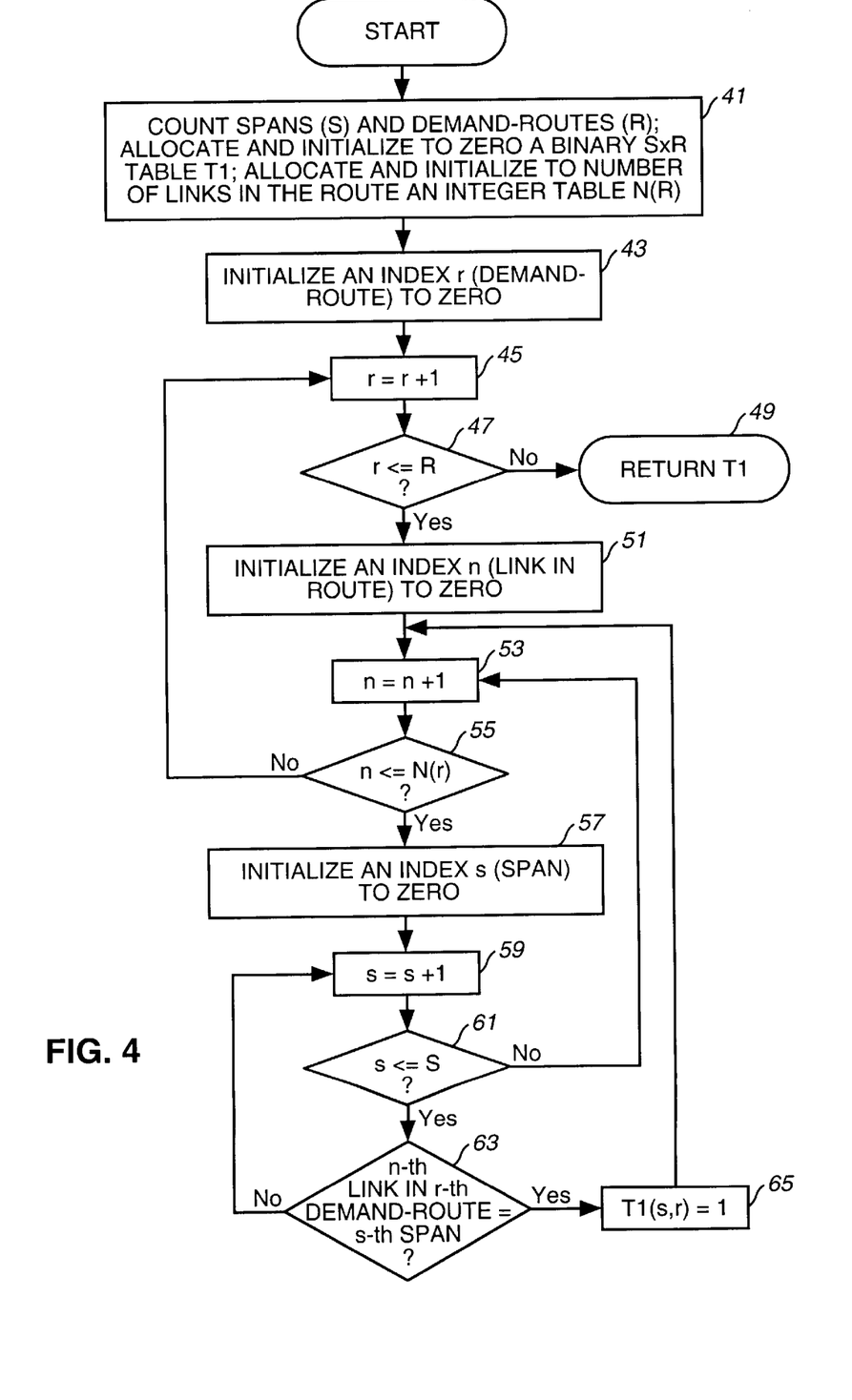
FIG. 4 is a flowchart of the construction of a span demand-route dependency matrix according to the present invention.
Figure 8:
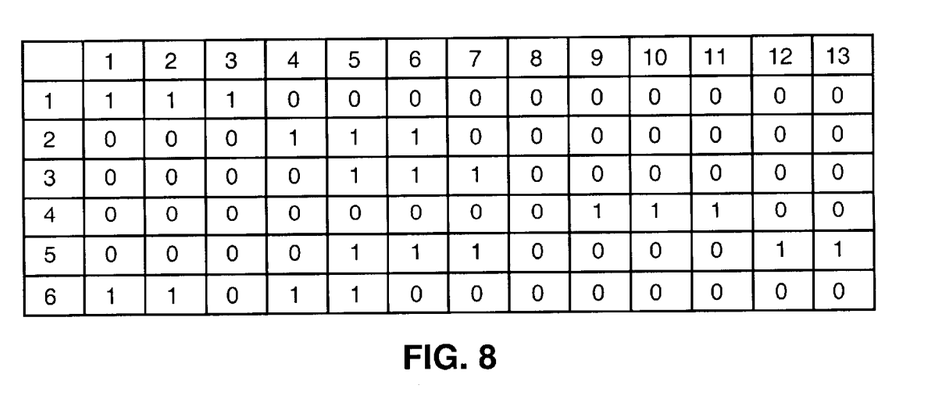
FIG. 8 is span demand-route dependency matrix for the network of FIG. 1 constructed according to the present invention.

After data gathering and coding, the method constructs a span-DR dependency matrix, as indicated generally at block 33 and shown in detail with respect to FIG. 4. A span-DR dependency matrix for the network of FIG. 1 is shown in FIG. 8. Referring to FIG. 8, the span-DR dependency matrix includes a row for each demand-route and a column for each span. An element of the span-DR dependency matrix is a 1 if the corresponding demand-route uses the corresponding span; otherwise, the element is 0. Thus, in FIG. 1, it may be seen, for example, that span 1 is used by demand-routes 1 and 6.

Figure 5:
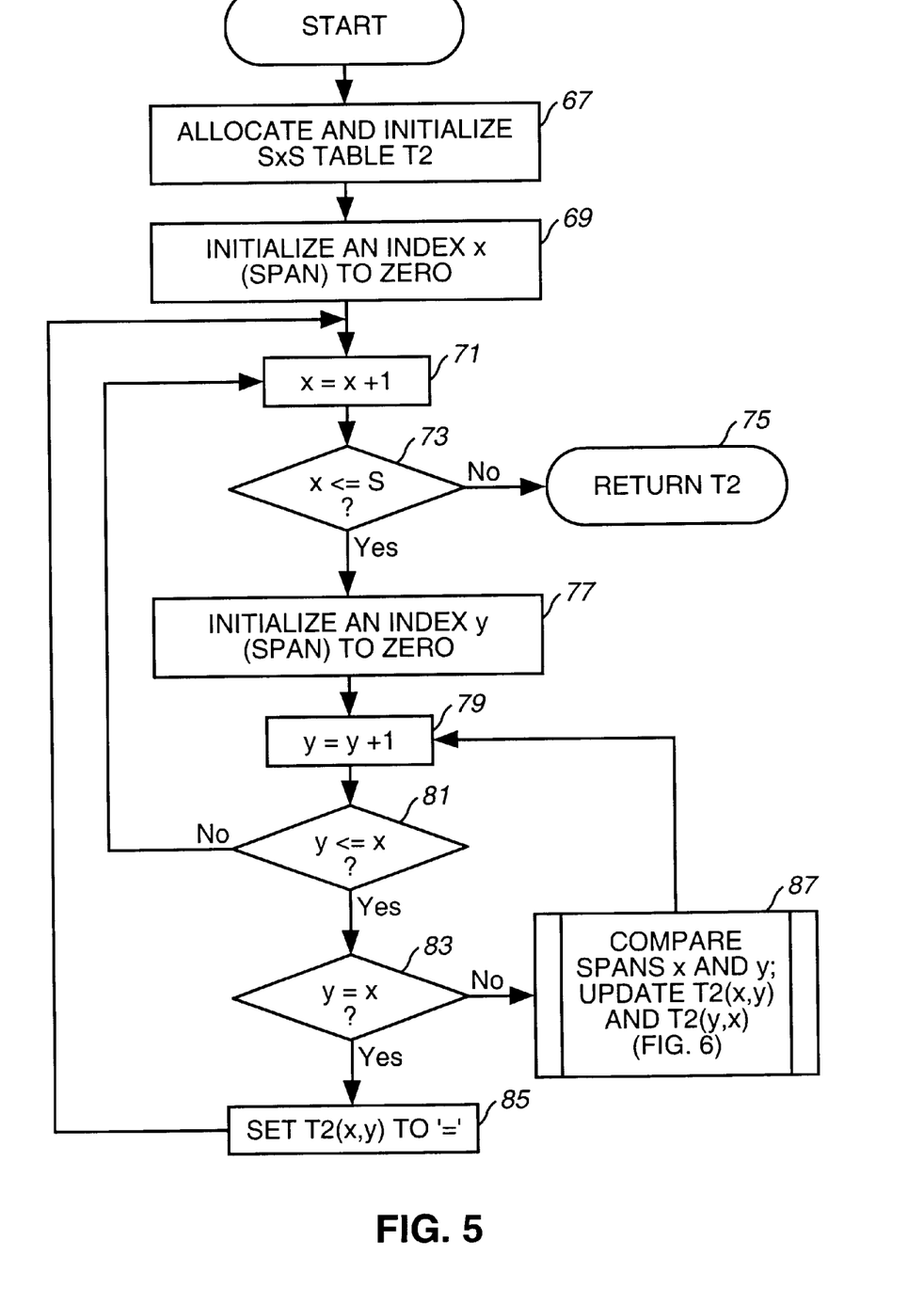
FIGS. 5 and 6 comprise a flowchart of the construction of a span hierarchy matrix according to the present invention.
Figure 9:
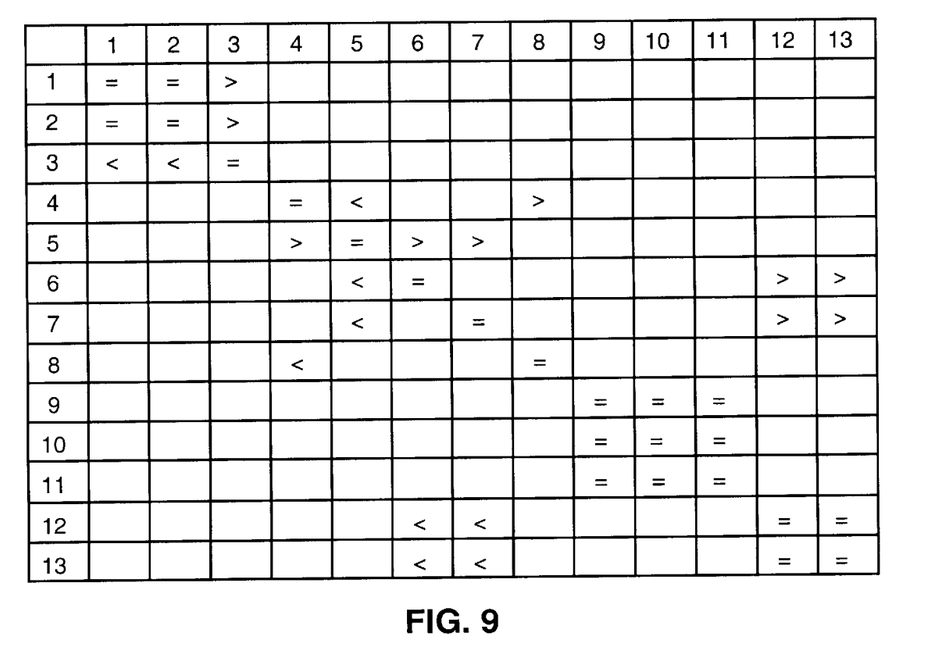
FIG. 9 is span hierarchy matrix for the network of FIG. 1 constructed according to the present invention.

After the method of the present invention has constructed be span demand-route dependency matrix, the method constructs a span hierarchy matrix, as indicated generally at block 35 and shown in detail with respect to FIG. 5. The span hierarchy matrix for the network of FIG. 1 is illustrated in FIG. 9. The span hierarchy matrix of FIG. 9 includes a row and a column for each span of the network. According to the present invention, the span hierarchy matrix is populated with indicia that indicate the hierarchical relationship of the span to the network. The default indicia is a blank, which indicates no relationship between the spans. An equal sign (=) indicates that the spans are either the same as or equivalent to each other. A greater than sign (>) indicates that the span of the row is a parent span of the span of the column. Thus, span 1 is a parent span of span 3. A less than sign (<) indicates that the span of the row is a child of the span of the column. Thus, span 3 is a child of spans 1 and 2. A critical span is a span that is not a child of any other span. The critical spans in the span hierarchy matrix of FIG. 9 are the spans corresponding to rows that have no less than signs. Thus, spans 1, 2, 5, 9, 10 and 11 are critical spans of network 21.

Figure 7:
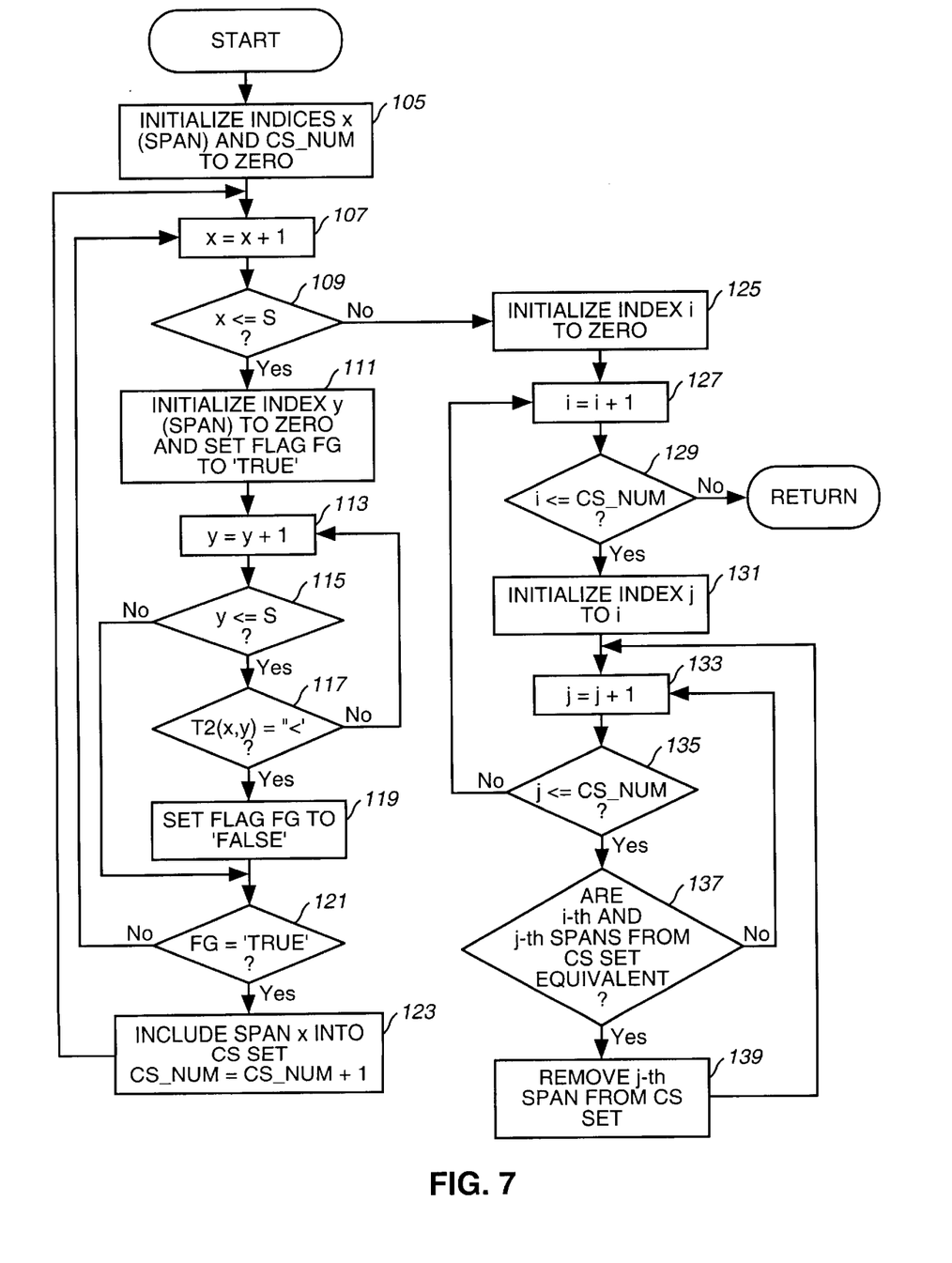
FIG. 7 is a flowchart of the selection of a minimal set of critical spans according to the present invention.

Referring again to FIG. 3, after the method of the present invention has constructed a span hierarchy matrix, then the method constructs a minimal set of critical spans, as indicated generally at block 37 and shown in detail with respect to FIG. 7.

Referring now to FIG. 4, which shows the construction of a span-DR dependency matrix, the method counts the spans and demand-Routes and allocates and initializes to zero a binary SxR table T1. The method also allocates and initializes to the number of links in the route an integer table N(R) for each demand-route R. Then, the method initializes an index r (demand-route) to zero, at block 43, and sets r equal to r+1 at block 45. Then, the method tests, at decision block 47, whether r is equal to or less than R. If not, which indicates that all demand-routes have been processed, the method returns the span-DR dependency matrix T1, at block 49. If, at decision block 47, r is equal to or less than R, then the method initializes an index n, which is the sequential number of the link in the r-th demand-route, to zero, at block 51, and sets n equal to n+1, at block 53. Then, the method tests, at decision block 55, whether or not n is equal to or less than N(r). If not, which indicates that all links of the demand-route have been processed, processing continues at block 45. If, at decision block 55, n is equal to or less than N(r), which indicates that not all links of the demand-route have been processed, then the method initializes an index s (span) to zero, at block 57, and sets s equal to s+1, at block 59. Then, the method tests, at decision block 61, whether s is equal to or less than S. If not, which indicates that not all spans have been processed, processing continues at block 53. If s is equal to or less than S, at decision block 61, then the method tests, at decision block 63, whether or not the n-th link in the r-th demand-route is equal to the s-th span. If not, processing continues at block 59. If, at decision block 63, n-th link and the r-th demand-route is equal to the s-th span, then the method sets element (s,r) of span-DR dependency matrix T1 to 1, at block 65, and processing continues at block 53. Thus, FIG. 4 processing continues until, at decision block 47, r is not equal to or less than R at which point FIG. 4 processing returns the span-DR dependency matrix T1, at block 49.

Referring now to FIG. 5, there is shown processing of the construction of a span hierarchy matrix as indicated generally at block 35, FIG. 3. The system allocates and initializes an SxS table T2, at block 67. For the thirteen span network of FIG. 1, span hierarchy matrix T2 is a thirteen by thirteen matrix, as shown in FIG. 9. The cells of the span hierarchy matrix T2 are initialized to blanks.

After allocating and initializing table T2, the system initializes an index x, which identifies a row in table T2, to zero, at block 69, and sets x equal to x+1 at block 71. The system then tests, at decision block 73, whether or not x is equal to or less than S, which is the number of spans in the network. If not, which indicates that all rows of span dependency matrix T2 have been processed, the system returns T2 at block 75. If, at decision block 73, x is equal to or less than S, the system,initializes an index y, which identifies the column of span hierarchy matrix T2, to zero, at block 77, and sets y equal to y+1, at block 79. Then, the system tests whether or not y is equal to or less than x, at decision block 81. If not, processing continues at block 71. If, at decision block 81, y is equal to or less than x, then the system tests, at decision block 83, whether y equals x. If so, the system sets element x,y of span hierarchy matrix T2 to "=", at block 85, and processing continues at block 71. Every span is trivially equivalent to itself. If, at decision block 83, y is not equal to x, then the system compares spans x and y and updates elements (x,y) and (y,x) of span hierarchy matrix T2, as indicated generally at block 87, and shown in detail with respect to FIG. 6.

Figure 6:
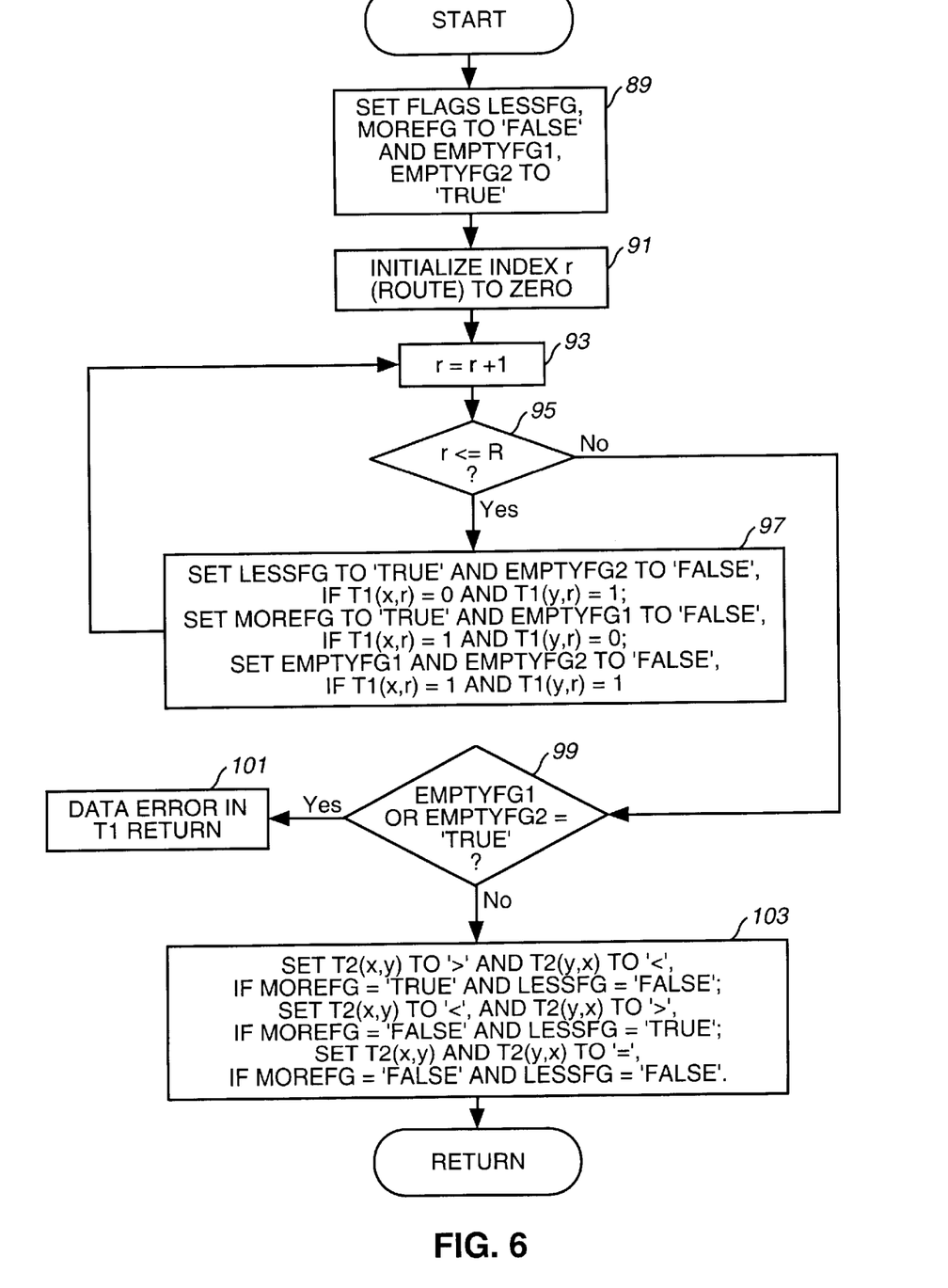

Referring now to FIG. 6, the system sets flags LESSFG and MOREFG to "false" and flags EMPTYFG1 and EMPTYFG2 to "true", at block 89. Then, the system initializes an index r, which corresponds to a demand-route row of span demand-route dependency matrix T1, to zero, at block 91. Then, the system sets r equal to r+1, at block 93, and tests whether or not r is equal to or less than R, which is the number of demand-routes in the network, at decision block 95. If yes, which indicates that not all rows of span demand-route dependency matrix T1 have been processed, then the system performs the process indicated at block 97.

Referring to block 97, if element (x,r) of span demand-route dependency matrix T1 is equal to 0 and element (y,r) of matrix T1 is equal to 1, then the system sets flag LESSFG to true and flag EMPTYFG2 to false. If element (x,r) of matrix T1 is equal to 1 and element (y,r) of matrix T1 is equal to 0, then the system sets flag MOREFG to true and flag EMPTYFG1 to false. If element (x,r) of matrix T1 is equal to 1 and element (y,r) of matrix T1 is also equal to 1, then the system sets both flags EMPTYFG1 and EMPTYFG2 to false.

After the system has performed block 97 processing, processing continues at block 93 where processing is performed with respect to the next row of span demand-route hierarchy matrix T1. Processing loops through block 97 until all rows of the span demand-route dependency matrix T1 have been processed.

After all rows of span demand-route dependency matrix T1 have been processed for a particular pair of spans x and y, then the system tests, at decision block 99, whether or not either flag EMPTYFG1 or flag EMPTYFG2 is equal to true. If yes, the system reports a data error in span demand-route dependency matrix T1, at block 101, and returns.

If, at decision block 99 neither flag EMPTYFG1 nor flag FG2 is equal to true, then the system performs processing indicated generally at block 103. If flag MOREFG equals true and flag LESSFG equals false, then the system sets element (x,y) of span hierarchy matrix T2 to greater than and element (y,x) of matrix T2 to less than. If flag MOREFG is equal to false and flag LESSFG is equal to true, then the system sets element (x,y) of matrix T2 to less than and element (y,x) of matrix T2 to greater than. If flag MOREFG equals false and flag LESSFG equals false, then the system S sets both elements (x,y) and (y,x) of matrix T2 to equal. Then, processing returns to block 79 of FIG. 5.

FIG. 6 processing can be best understood with respect to examples. First, consider processing with respect to element (2,1) of FIG. 9, which processing is summarized in the following table 1.

TABLE 1

|          | 0 | 1 | 2 | 3 | 4 | 5 | 6 |
|----------|---|---|---|---|---|---|---|
| LESSFG   | F | F | F | F | F | F | F |
| MOREFG   | F | F | F | F | F | F | F |
| EMPTYFG1 | T | F | F | F | F | F | F |
| EMPTYFG2 | T | F | F | F | F | F | F |

Flags LESSFG and MOREFG are initially set to false and flags EMPTYFG1 and EMPTYFG2 are initially set to true. In the first iteration through block 97, the values of elements (2,1) and (1,1) of span demand-route dependency matrix T1 (FIG. 8) are tested, Referring to FIG. 8, both elements (1,1) and (2,1) equal to 1. According to block 97 of FIG. 6, both flags EMPTYFG1 and EMPTYFG2 are set to false. On the next iteration, block 97 determines that both elements (2,2) and (1,2) of FIG. 8 are equal to zero. According to FIG. 97 processing, when both elements are equal to 0, none of the flags are changed. For iterations 3–5, both elements (2,r) and (1,r) are equal to 0. Accordingly, there is no change to the flag settings during those iterations. In the sixth iteration, elements (2,6) and (1,6) of FIG. 8 are both equal to 1. Accordingly, both flags EMPTYFG1 and EMPTYFG2 are set to false. Referring to block 103 of FIG. 6, since both flags MOREFG and LESSFG are set to false, elements (2,1) and (1,2) of span hierarchy matrix T2 are set to =, shown in FIG. 9.

As another example of FIG. 6 processing, consider processing for element (3,1) of FIG. 9, as shown in the following Table 2.

TABLE 2

|          | 0 | 1 | 2 | 3 | 4 | 5 | 6 |
|----------|---|---|---|---|---|---|---|
| LESSFG   | F | F | F | F | F | F | T |
| MOREFG   | F | F | F | F | F | F | F |
| EMPTYFG1 | T | F | F | F | F | F | F |
| EMPTYFG2 | T | F | F | F | F | F | F |

Again, flags LESSFG and MOREFG are initially set to false and flags EMPTYFG1 and EMPTYFG2 are initially set to true. On the first iteration, block 97 processing determines that elements (3,1) and (1,1) of FIG. 8 are both equal to 1. Thus, flags EMPTYFG1 and EMPTYFG2 are both set to false. On iterations 2–5, block 97 processing determines that elements (3,r) and (1,r) are equal to 0. Thus, for iterations 2–5, the setting of the flags does not change. In iteration 6, however, block 97 processing determines that element (3,6) of FIG. 8 is equal to 0 while element (1,6) is equal to 1. Thus, according to block 97 processing, flag LESSFG is set to true and flag EMPTYFG2 is set to false. Thus, at the completion of FIG. 97 processing, flag LESSFG is true and flag MOREFG is false. Referring to block 103 at FIG. 6, since flag MOREFG is false and flag LESSFG is true, element (3,1) of FIG. 9 is set to <and element (1,3) of FIG. 9 is set to >.

Referring again to FIG. 3, after the system has constructed a span hierarchy matrix, at block 35, the system constructs a minimum set of critical spans, as indicated generally at block 37 and shown in detail with respect to FIG. 7. Referring to FIG. 7, the system initializes an index x, which is a span, and a critical span number (CS_NUM) to zero, at block 105, and then sets x equal to x+1, at block 107. Then, the system tests, at decision block 109, whether or not x is equal to or less than S, which is the number of spans in the network. If yes, the system initializes an index y, which is a span, to zero and sets a flag FG to true at block 111. Then, the system sets y equal to y+1, at block 113, and tests whether or not y is equal to or less than S, at decision block 115. If yes, the system tests, at decision block 117, whether or not element (x,y) of span hierarchy matrix T2 is equal to <. If not, processing returns to block 113.

If, at decision block 117, element (x,y) of span hierarchy matrix T2 is equal to <, then the system sets flag FG to false, at block 119. When y is not equal to or less than S, at decision block 115, or the system sets flag FG to false, at block 119, the system tests, at decision block 121, whether or not flag FG is equal to true. If not, processing continues at block 107 where the next row of span hierarchy matrix T2 is processed. If, at decision block 121, flag FG is equal to true, then the system includes span x into the critical span set and lets CS_NUM equal CS_NUM+1, at block 123, and processing continues at block 107. Processing continues through blocks 107–123 until x is not equal to or less than S, at decision block 109, which indicates that all rows of span hierarchy matrix T2 have been processed.

When, at decision block 109, the system determines that all spans have been processed, the system determines a minimal set of critical spans. First, the system initializes an index i to zero, at block 125. Index i identifies each element of the set of critical spans. The system sets i equal to i+1, at block 127, and tests, at decision block 129, whether or not index i is equal to or less than CS_NUM, which is the number of critical spans. If yes, the system initializes an index j to i, at block 131, and sets j equal to j+1, at block 133. Then, the system tests, at decision block 135, whether or not j is equal to or less than CS_NUM. If not, processing continues at block 127. If index j is equal to or less than CS_NUM, then the system tests, at decision block 137, if the i-th and j-th spans from the set of critical spans are equivalent. Equivalency is determined from span hierarchy matrix T2. If element (i,j) of span hierarchy matrix is set to =, then the spans are equivalent.

Referring to FIG. 9, where i is 1 and j is 2, the spans are equivalent. If, at decision block 137, the i-th and j-th spans from the critical span set are not equivalent, processing continues at block 133. If, at decision block 137, the i-th and j-th spans from the critical span set are equivalent, then the system removes the j-span from the set of critical spans, at block 139, and processing continues at block 133. Thus, processing according blocks 125–139 continues until, as determined at decision block 129, all spans have been processed. When all spans have been processed, the system has determined a minimal number of critical spans.

With the minimal set of critical spans determined according to the present invention, cut fiber simulations can be run much more efficiently and in much less time. The present invention gives the network designer a computer-implemented tool by which the designer determine a minimal set of critical spans quickly.

What is claimed is:

1. In a network comprising a plurality of nodes interconnected by a plurality of fiber spans and said network including a plurality of demand-routes, a method comprising computer implemented steps of:

selecting from said plurality of spans a set of critical spans, wherein said step of selecting a set of critical spans from said plurality of spans comprises the computer implemented steps of:
  constructing a span demand-route dependency matrix; and,
  constructing a span hierarchy matrix; and,
  selecting from said set of critical spans a minimal set of critical spans.

2. The method as claimed in claim 1, wherein said step of selecting from said set of critical spans a minimal set of critical spans includes the computer implemented steps of:
  removing from said set of critical spans any span that is equivalent to another span of said set of critical spans.

3. The method as claimed in claim 2, wherein said step of removing from said set of critical spans any span that is equivalent to another span of said set of critical spans comprises the computer implemented steps of:
  selecting a first span from said set of critical spans;
  selecting a second span from said set of critical spans; and,
  removing said second span from said set of critical spans if said second span is equivalent to said first span.

4. The method as claimed in claim 1, wherein said step of selecting a set of critical spans comprises the computer implemented steps of:
  for each span of said network, determining a set of demand-routes that use each said span;
  for each span of said network, determining which other spans of said network have an identical set of demand-routes;
  for each span of said network, determining which other spans of said network have a set of demand-routes that is a proper subset of the set of demand-routes of said each span;
  for each span of said network, determining which other spans of said network have a set of demand-routes of which the set of demand-routes for said each span is a proper subset; and,
  selecting a set of critical spans such that the set of demand-routes of a critical span is not a proper subset of a set of demand-routes of any other span of said network.

5. The method as claimed in claim 4, wherein said step of selecting from said set of critical spans a minimal set of critical spans comprises the computer implemented step of:
  removing from said set of critical spans any span determined to have a set of demand-routes identical to the set of demand-routes of another span of said set of critical spans.

6. The method as claimed in claim 5, wherein said step of removing from said set of critical spans any span that is equivalent to another span of said set of critical spans comprises the computer implemented steps of:
  selecting a first span from said set of critical spans;
  selecting a second span from said set of critical spans; and,
  removing said second span from said set of critical spans if the set of demand-routes of said second span is identical to the set of demand-routes of first span.

7. The method as claimed in claim 1, wherein said span demand-route dependency matrix has a row for each demand-route and a column for each span.

8. The method as claimed in claim 7, wherein said step of constructing a span demand-route dependency matrix comprises the computer implemented step of:
  for each row of said span demand-route dependency matrix, inserting a first value in a position of said each row if the span of the column corresponding to said position corresponds to a link of the demand-route of row.

9. The method as claimed in claim 8, wherein said first value is a one.

10. The method as claimed in claim 9, wherein said span hierarchy matrix includes a row for each span and a column for each span.

11. The method as claimed in claim 10, wherein said step of constructing a span hierarchy matrix includes the computer implemented steps of:
  assigning a numerical value to each span of said network;
  assigning one of said numerical values to each row and column of said span hierarchy matrix;
  selecting an x-th row of said span hierarchy matrix;
  selecting a y-th column of said span hierarchy matrix;
  inserting a first indicia at element (x,y) of said span hierarchy matrix if x is equal to y.

12. The method as claimed in claim 11, including, if x is not equal to y, the computer implemented steps of:
  setting a less flag to false;
  setting a more flag to false;
  setting a first empty flag to true; and,
  setting a second empty flag to true.

13. The method as claimed in claim 12, including the computer implemented steps of:
  selecting an r-th row of said span demand-route hierarchy matrix; and,
  setting said less flag to true and one of said empty flags to false if element (x,r) of said span demand-route dependency matrix is equal to zero and element (y,r) of said span demand-route dependency matrix is equal to one.

14. The method as claimed in claim 13, including the computer implemented step of:
  setting said more flag to true and the other of said empty flags to false if said element (x,r) is equal to one and said element (y,r) is equal to zero.

15. The method as claimed in claim 14, including the computer implemented step of:
  setting both of said empty flags to false if said element (x,r) is equal to one and said element (y,r) is equal to one.

16. The method as claimed in claim 15, including the computer implemented step of:
  setting each of elements (x,y) and (y,x) of said span hierarchy matrix to said first indicia if both said more flag and said less flag are false.

17. The method as claimed in claim 16, including the computer implemented step of:
  setting said element (x,y) to a second indicia and said element (y,x) to a third indicia if said more flag is true and said less flag is false.

18. The method as claimed in claim 17, including the computer implemented step of:
  setting said element (x,y) to said third indicia and said element (y,x) to said second indicia if said less flag is true and said more flag is false.

19. The method as claimed in claim 18, wherein said step of selecting a set of critical spans includes the further computer implemented steps of:
  selecting an x-th row of said span hierarchy matrix;
  setting a flag to true;
  selecting a y-th column of said span hierarchy matrix;
  setting said flag to false if element (x,y) of said span hierarchy matrix is equal to said third indicia; and, including span x in said set of critical spans if said flag is set to true.

20. The method as claimed in claim 19, wherein said step of selecting a minimal set of critical spans includes the computer implemented steps of:

selecting an i-th span from said set of critical spans;

selecting a j-th span from said set of critical spans; and, removing said j-th span from said set of critical spans if element (i,j) of said span hierarchy matrix is equal to said first indicia.

* * * * *